United States Patent [19]
Omura et al.

[11] Patent Number: 5,298,769
[45] Date of Patent: Mar. 29, 1994

[54] GTO THYRISTOR CAPABLE OF PREVENTING PARASITIC THYRISTORS FROM BEING GENERATED

[75] Inventors: Ichiro Omura, Yokohama; Mitsuhiko Kitagawa, Tokyo, both of Japan

[73] Assignee: Kabushiki Kaisha Toshiba, Kawasaki, Japan

[21] Appl. No.: 40,595

[22] Filed: Mar. 31, 1993

[30] Foreign Application Priority Data

Mar. 31, 1992 [JP] Japan ..................... 4-105674

[51] Int. Cl.$^5$ ............... H01L 29/74; H01L 27/02; H01L 29/10
[52] U.S. Cl. ..................... 257/138; 257/122; 257/124; 257/128; 257/132; 257/135; 257/147; 257/152; 257/153; 257/163; 257/167
[58] Field of Search ............ 257/119, 122, 124, 128, 257/132, 133, 135, 138, 147, 150, 152, 153, 154, 163, 167

[56] References Cited

U.S. PATENT DOCUMENTS

| | | | |
|---|---|---|---|
| 4,760,431 | 7/1988 | Nakagawa et al. | 257/138 |
| 4,967,255 | 10/1990 | Bauer et al. | 257/153 |
| 5,105,244 | 4/1992 | Bauer | 257/138 |
| 5,144,400 | 9/1992 | Bauer | 257/138 |

FOREIGN PATENT DOCUMENTS 61-58264  3/1986  Japan ..................... 257/138

OTHER PUBLICATIONS

Baliga, Proceedings of 1990 International Symposium on Power Semiconductor Devices & ICs, pp. 117-121. "The MOS-Gated Emitter Switched Thyristor".

*Primary Examiner*—Ngan Ngo
*Attorney, Agent, or Firm*—Oblon, Spivak, McClelland, Maier & Neustadt

[57] ABSTRACT

A GTO thyristor includes a p-type emitter layer, an n-type base layer, a p-type base layer and an n-type emitter layer. An additional n-type layer is formed on the p-type base layer next to the n-type emitter layer An additional p$^+$-type layer is formed on the additional n-type layer and stretches to the n-type emitter layer. An anode electrode and a cathode electrode are disposed respectively on the n-type emitter layer and the p-type base layer. The n-type emitter layer and the additional p$^+$-type layer are connected with each other by a floating electrode. A first gate electrode is disposed on the additional p$^+$-type layer, additional n-type layer and p-type base layer with an insulating film interposed therebetween so as to form a first FET. A second gate electrode is disposed on the n-type base layer, p-type base layer and n-type emitter layer with an insulating film interposed therebetween so as to form a second FET. A thyristor having such a configuration can effectively prevent a latched-up condition caused by parasitic transistors or thyristors to ensure turn off operations of the host thyristor.

16 Claims, 18 Drawing Sheets

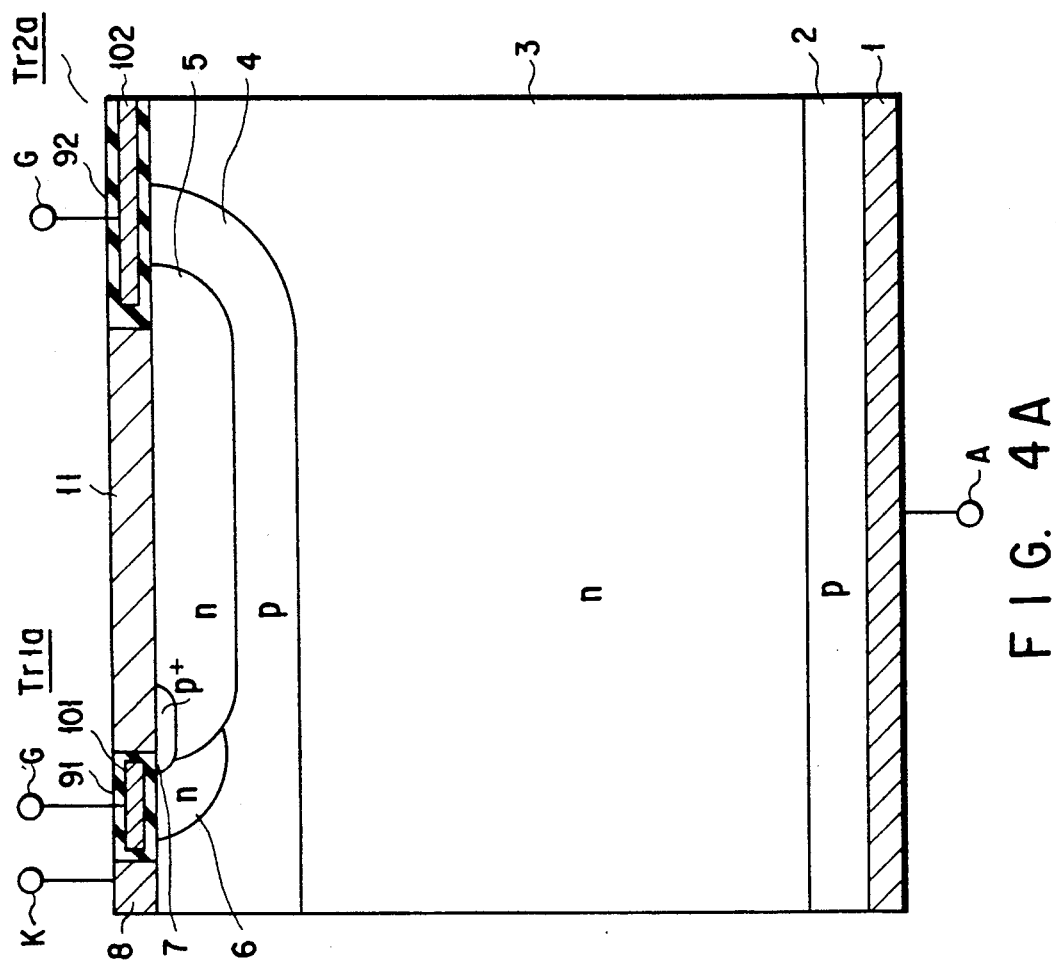
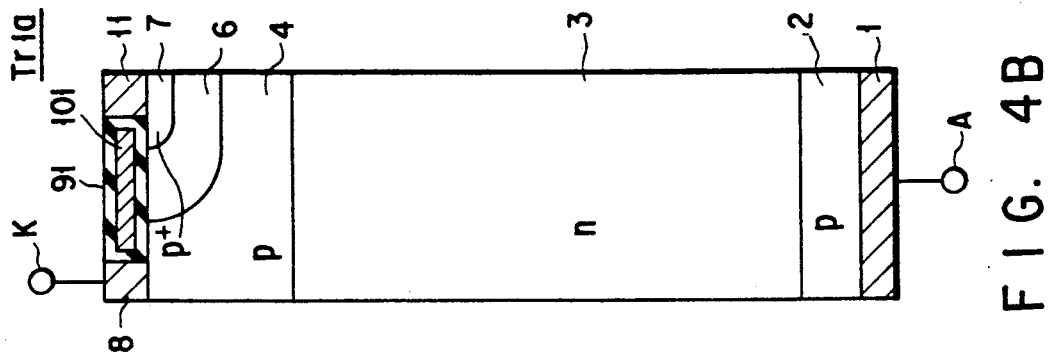
FIG. 4A
FIG. 4B

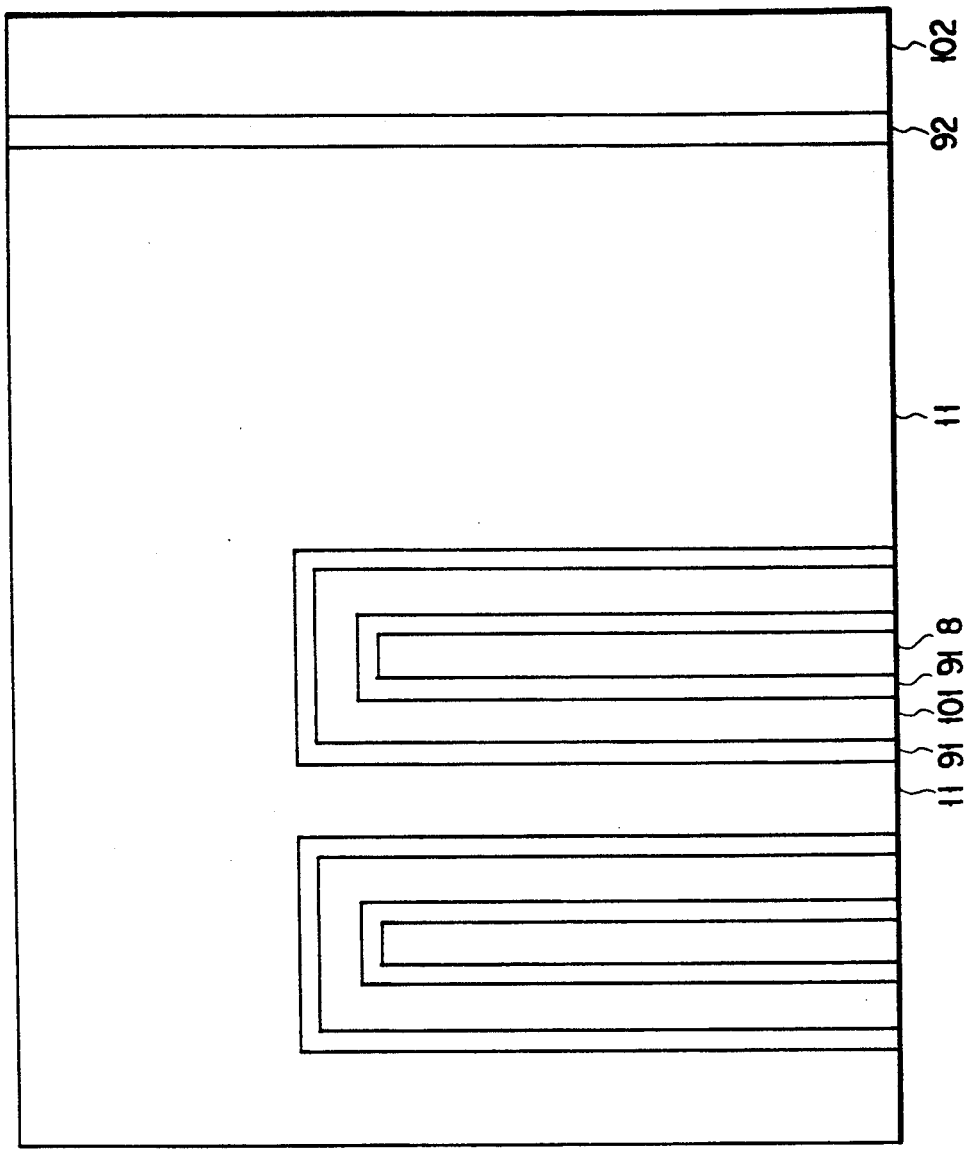

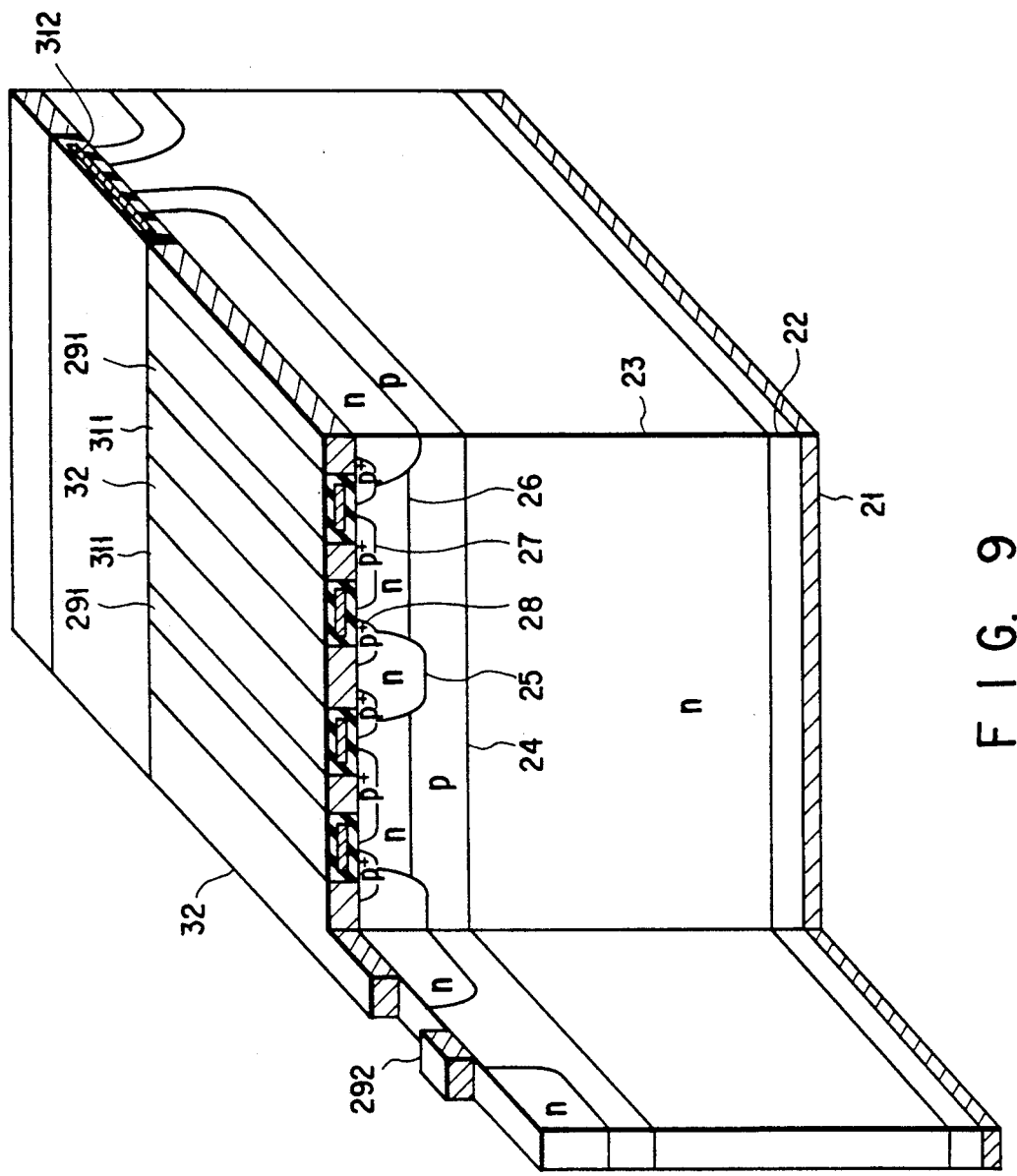
F I G. 9

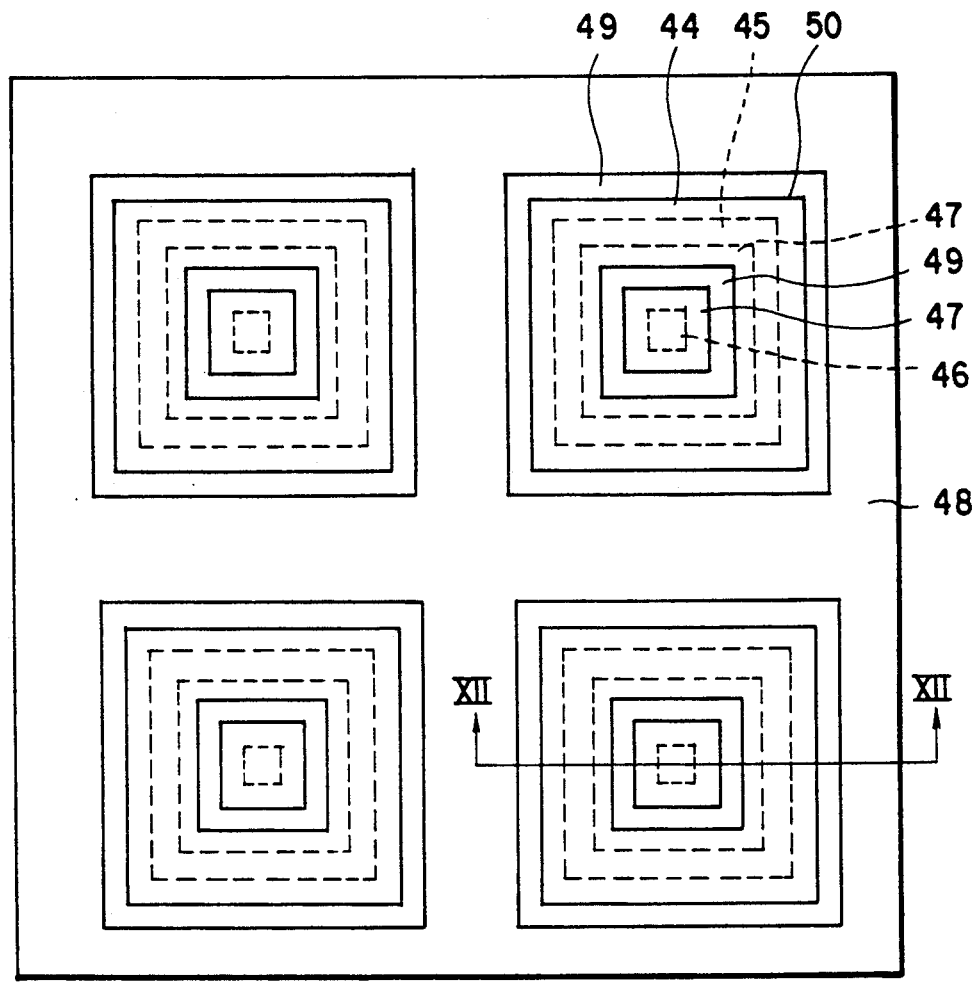
F I G. 11

GTO THYRISTOR CAPABLE OF PREVENTING PARASITIC THYRISTORS FROM BEING GENERATED

BACKGROUND OF THE INVENTION

1. Field of the Invention

This invention relates to a thyristor and, more particularly, it relates to an improved GTO thyristor 2. Description of the Related Art Conventionally, a GTO thyristor is turned off by drawing out the electric current within the device through a gate electrode directly fitted to the base layer of the device by means of a current-driven type drive device. Such a current-driven technique, however, requires the use of a gate circuit adapted to accommodate large electric power and hence of a large drive device.

A voltage control type GTO thyristor comprising an insulated gate such as an EST (emitter switched thyristor) has been proposed to bypass the above identified problem.

FIG. 19 of the accompanying drawings illustrates in cross section a known EST.

The EST comprises an n-base layer 83, a p-emitter layer 82 formed on one of the surface of the n-base layer 83, an anode electrode 81 disposed on the p-emitter layer 82, a p-base layer 84 selectively formed on the other surface of the n-base layer 83 and an n-emitter layer 85 selectively formed on the surface of the p-base layer 84, said semiconductor layers 82 through 85 providing this device with a thyristor portion through their pnpn structure.

A p+-layer 86 and an n+-layer 87 are formed side by side on the surface of the p-base layer 84 and a cathode electrode 88 is arranged to bridge the surface of the p+-layer 86 and that of the n+-layer 87. A gate electrode 90 is disposed on the p-base layer 84 to bridge the n+-layer 87 and n-emitter layer 85 with a gate oxide film 89 interposed therebetween, said p-base layer 84, n-emitter layer 85, n+-layer 87, gate oxide layer 89 and gate electrode 90 constituting an n-channel MOSFET (metal oxide semiconductor field effect transistor) Tr1.

Similarly, another gate electrode 80 is disposed on the n-emitter layer 85, the p-base layer 84 and the n-base layer 83 with an insulation film 79 interposed therebetween, said n-emitter layer 85, p-base layer 84, n-base layer 83, gate oxide film 79 and gate electrode 80 constituting another n-channel MOSFET Tr2.

A GTO thyristor having a configuration as described above is turned on by applying a positive voltage to the gate terminal G in relation to the cathode terminal K, while applying a forward voltage between the anode terminal A and the cathode terminal K.

As the voltages are applied, an n-channel ch1 is produced on the surface of the p-base layer 84 between the n+-layer 87 and the n-emitter layer 85 while another n-channel ch2 is produced on the surface of the p-base layer 84 between the n-emitter layer 85 and the n-base layer 83 so that electrons may flow from the n+-layer 87 to the n-emitter layer 85 by way of the first n-channel ch1 and from the n-emitter layer 85 to the n base layer 83 via the second n-channel ch2.

Thus, a base current takes place in a transistor constituted by a p-emitter layer 82, an n-base layer 83 and a p-base layer 84.

On the other hand, holes of the p-emitter layer 82 are made to flow from there to the p-base layer 84 through the n-base layer 83.

In other words, another base current takes place in another transistor constituted by an n-base layer 83, a p-base layer 84 and an n-emitter layer 85.

Consequently, the first transistor constituted by a p-base layer 82, an n-base layer 83 and a p-base layer 84 and the second transistor constituted by an n-base layer 83, a p-base layer 84 and an n-emitter layer 85 mutually amplify the respective collector currents of the other parties to turn on the thyristor.

The thyristor can be turned off by applying a negative voltage to the gate terminal G in relation to the cathode terminal K to turn off the MOSFET Tr1 and stop the supply of electrons to the n-emitter layer 85.

However, a thyristor of the above described type is accompanied by problems as described below.

As a flow of holes runs into the cathode electrode 88 through the p-base layer 84 under n+-layer 87, the p-base layer 84 shows a voltage drop due to the resistance of the p-base layer 84.

The voltage drop forwardly biases the n+-layer 87 and the p-base layer 84 so that electrons flow from the n+-layer 87 into the n-base layer 83 by way of the p-base layer 84. Consequently, a parasitic thyristor PT constituted by the n+-layer 87, the p-base layer 84, the n-base layer 83 and the p emitter layer 82 comes into existence and latches up the host thyristor HT. Since electric current flows through the parasitic thyristor, the current cannot be prevented from flowing through the device even when the host is turned off.

Additionally, the voltage drop turns on another parasitic transistor constituted by the n+-layer 87, the p-base layer 84 and the n-emitter layer 85 to cause electrons to flow into the n-emitter layer 85 so that, again, the host thyristor constituted by the p-emitter layer 82, the n-base layer 83, the p-base layer 84 and the n-emitter layer 85 is forced to continue its operation after the gate is turned off.

SUMMARY OF THE INVENTION

It is, therefore, an object of the present invention to provide an improved GTO thyristor that can effectively prevent any parasitic thyristors from being generated and exerting any harmful effects on the host so that it can be securely turned off whenever desired.

According to a first aspect of the invention, there is provided a GTO thyristor comprising:

a first conductivity type emitter layer, a second conductivity type base layer, a first conductivity type base layer and a second conductivity type emitter layer arranged to form a pnpn structure;

a first region formed of a second conductivity type semiconductor, the first region being in contact with the second conductivity type emitter layer;

a second region formed of a first conductivity type semiconductor, the second region stretching from the first region to the second conductivity type emitter layer;

a third region formed of a first conductivity type semiconductor, the third region being disposed opposite to the second region with the first region disposed therebetween, the third region being connected with the first conductivity type base layer;

a first main electrode connected to the first conductivity type emitter layer;

a second main electrode connected to the third region;

a conductive layer formed on the second conductivity type emitter layer and the second region to connect them;

a first gate electrode disposed on the first region with an insulating film interposed therebetween so as to form a first FET, the first FET utilizing the surface of the first region as a first conductivity type channel; and a second gate electrode disposed on the first conductivity type base layer with an insulating film interposed therebetween so as to form a second FET, the second FET utilizing the surface of the first conductivity type base layer as a second conductivity type channel.

According to a second aspect of the invention, there is provided a GTO thyristor comprising:

a first conductivity type emitter layer;

a second conductivity type base layer held in contact with the first conductivity type emitter layer;

first conductivity type base layer held in contact with the second conductivity type base layer but not with the first conductivity type emitter layer, the first conductivity type base layer having first and second portions separated from and arranged opposite to each other;

a second conductivity type emitter layer held in contact with the second conductivity type base layer but not with the first conductivity type emitter layer, the second conductivity type emitter layer being disposed between the first and second portions of the first conductivity type base layer;

a first region formed of a second conductivity type semiconductor, the first region having a first portion formed between the second conductivity type emitter layer and the first portion of the first conductivity type base layer and a second portion formed between the second conductivity type emitter layer and the second portion of the first conductivity type base layer;

a second region formed of a first conductivity type semiconductor, the second region stretching from the first region to the second conductivity type emitter layer, the second region having first and second portions with the second conductivity type emitter layer therebetween, the first and second portions being respectively disposed opposite to the first and second portions of the first conductivity type base layer with the first and second portions of the first region disposed therebetween;

a first main electrode connected to the first conductivity type emitter layer;

a second main electrode connected to the first conductivity type base layer;

a conductive layer formed on said second conductivity type emitter layer and said second region to connect them; and a gate electrode disposed on said first region with an insulating film interposed therebetween so as to form a FET, said FET having first and second portions, said first and second portions utilizing the surfaces of said first and second portions of said first region as first conductivity type channels.

According to a third aspect of the invention, there is provided a GTO thyristor comprising:

a first conductivity type emitter layer, a second conductivity type base layer, a first conductivity type base layer and a second conductivity type emitter layer arranged to form a pnpn structure;

a first region formed of a second conductivity type semiconductor, the first region being in contact with the second conductivity type emitter layer and the first conductivity type base layer;

a second region formed of a first conductivity type semiconductor, the second region stretching from the first region to the second conductivity type emitter layer;

a third region formed of a first conductivity type semiconductor, the third region being disposed opposite to the second region with a first portion of the first region disposed therebetween and to the first conductivity type base layer with a second portion of the first region disposed therebetween;

a first main electrode connected to the first conductivity type emitter layer;

a second main electrode connected to the third region;

conductive layer formed on the second conductivity type emitter layer and the second region to connect them;

a first gate electrode disposed on the first region with an insulating film interposed therebetween so as to form a first FET, the first FET utilizing the surface of the first portion of the first region as a first conductivity type channel; and a second gate electrode disposed on the first conductivity type base layer and the first region with an insulating film interposed therebetween so as to form a second FET, the second FET utilizing the surface of the first conductivity type base layer as a second conductivity type channel and the surface of the second portion of the first region as a fist conductivity type channel.

With a GTO thyristor according to the invention, there does not occur any flow of carriers from the first region of a second conductivity type semiconductor because the first region of the second conductivity type semiconductor does not contact the second main electrode and therefore there cannot appear a phenomenon where a forward bias voltage is applied between the first conductivity type base layer and the first region when the thyristor is turned off.

In other words, since only a region of the first conductivity type contacts the second main electrode, neither parasitic thyristor nor transistor can appear and exert harmful effects on the host thyristor and the host can be securely turned off.

The second main electrode of a GTO thyristor according to the invention is electrically connected to the second conductivity type emitter layer by way of the first conductivity type channel formed in the first region to supply an electric current to the second conductivity type emitter layer. Thus, the thyristor can be turned on although the first region is not held in contact with the second main electrode.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 4A and 4B are sectional views of the GTO thyristor of FIG. 3 respectively taken along IVA—IVA line and IVB—IVB line;

FIG. 5 is a schematic plan view of another GTO thyristor similar to that of FIG. 1 but again obtained by modifying it;

FIG. 9 is a partially cutout schematic perspective view of the embodiment of FIG. 7;

FIG. 11 is a schematic plan view of a fifth embodiment of GTO thyristor of the invention;

DETAILED DESCRIPTION OF THE PREFERRED EMBODIMENTS

Figure 1:
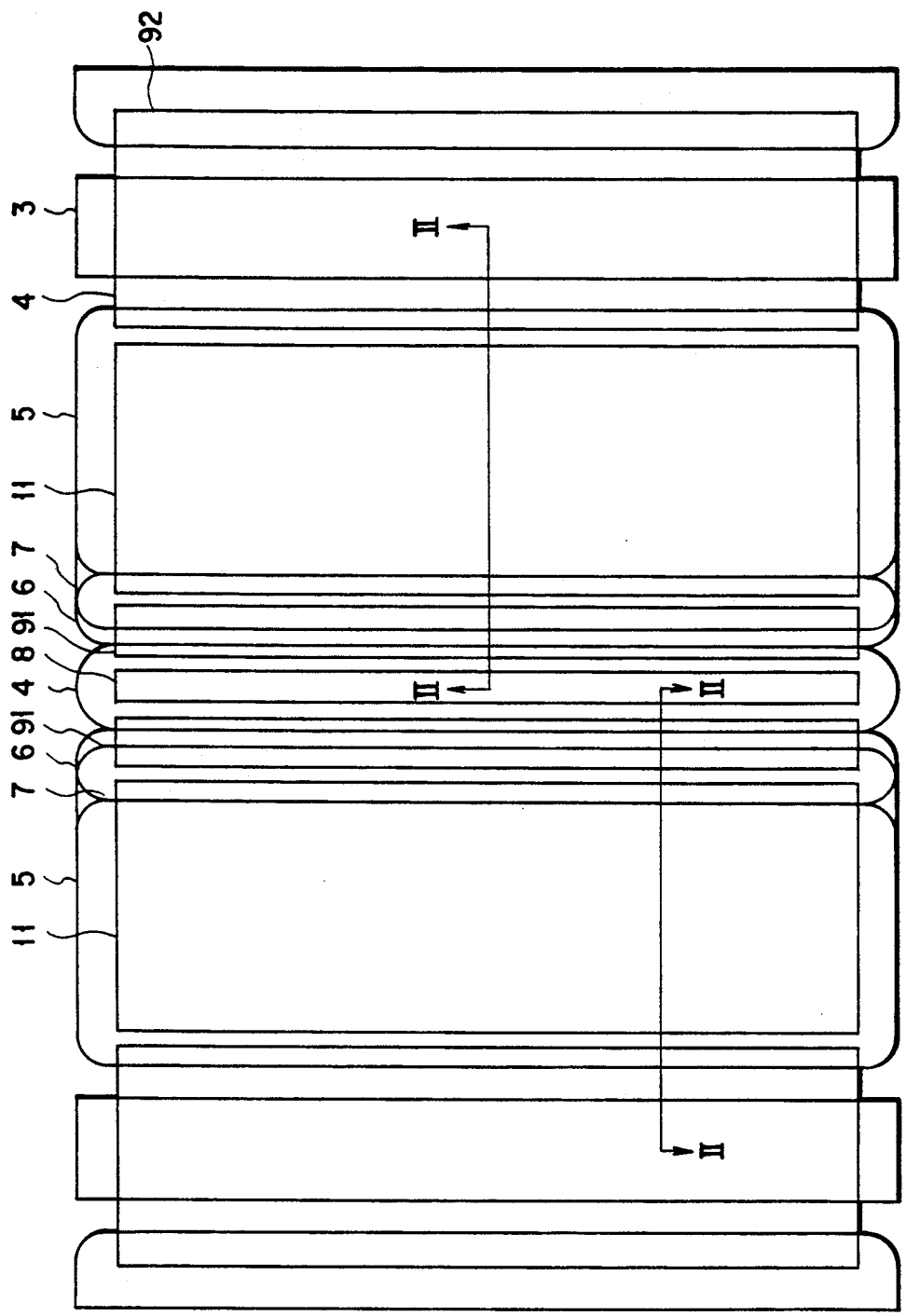
FIG. 1 is a schematic plan view of a first embodiment of GTO thyristor according to the invention.
Figure 2:
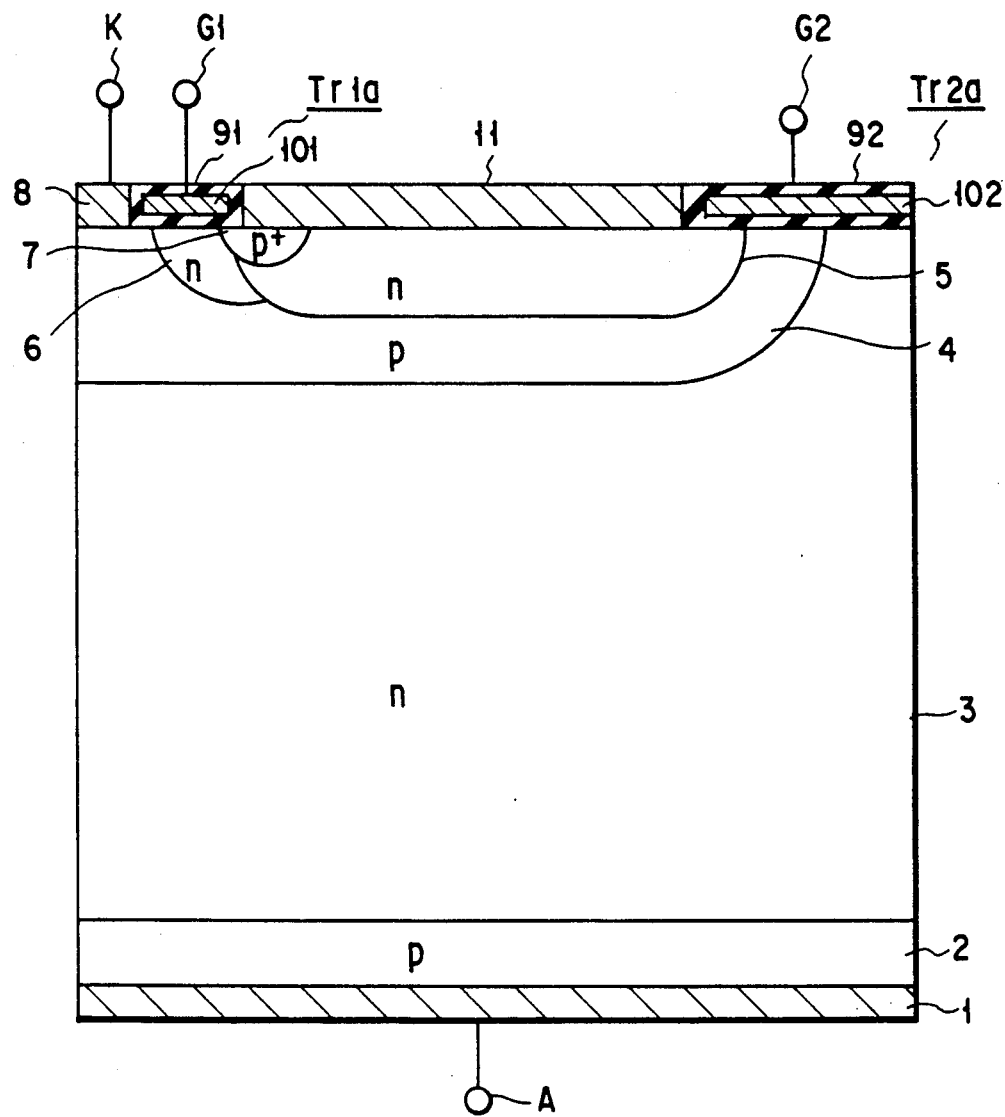
FIG. 2 is a sectional view of the embodiment of FIG. 1 taken along II—II line.

FIG. 1 is a schematic plan view of a first embodiment of GTO thyristor according to the invention and FIG. 2 is a sectional view of the embodiment of FIG. 1 taken along II—II line.

Like a conventional GTO thyristor, this embodiment comprises an n-base layer 3, a p-emitter layer 2 formed on one of the surfaces of the n-base layer 3 by diffusion, an anode electrode 1 disposed under the p-emitter layer 2, a p-base layer 4 selectively formed on the other surface of the n-base layer 3 by diffusion and an n-emitter layer 5 selectively formed on the surface of the p-base layer 4 by diffusion, said layers 2 through 5 providing a pnpn structure.

A channel forming n-layer 6 is formed on the surface of the p-base layer 4 and junctioned to the n-emitter layer 5. A p+-layer 7 is formed to bridge the surface of the n-layer 6 and that of the n-emitter layer 5. A cathode electrode 8 is disposed on the surface of the p-base layer 4 and a p-channel MOSFET Tr1a is formed next to the cathode electrode 8. In fact, the MOSFET Tr1a is constituted by the p-base layer 4, the n-layer 6, the p+-layer 7 and a gate electrode 101 disposed on the semiconductor layers 4, 6 and 7 with a gate oxide film 91 interposed therebetween. The break down voltage between the n-emitter layer 5 and the p-base layer 4 is set to a value higher than that of the threshold voltage of the MOSFET Tr1a.

On the other hand, a MOSFET Tr2a is formed on the surfaces of the n-base layer 3, the p-base layer 4 and the emitter layer 5. As a matter of fact, the MOSFET Tr2a is constituted by the n-base layer 3, the p-base layer 4, the emitter layer 5 and a gate electrode 102 disposed on the semiconductor layers 3, 4 and 5 with a gate oxide film 92 interposed therebetween.

The anode electrode 1, the cathode electrode 8, the gate electrodes 91 and 92 and the n-emitter layer 5 are respectively provided with an anode terminal A, a cathode terminal K, gate terminals G1 and G2 and a floating electrode 11.

To turn on a GTO thyristor having a configuration as described above, a forward voltage is applied between the anode terminal A and the cathode terminal K and then, under this condition, a negative voltage is applied to the gate terminal G1 relative to the cathode terminal K while a positive voltage is applied to the gate terminal G2 relative to the cathode terminal K.

When such voltages are applied to the respective terminals, the cathode electrode 8 is electrically connected to the floating electrode 11 by way of the p-channel formed on the n-layer 6 and the p+-layer 7.

At the same time, electrons are made to flow from the n-emitter layer 3 into the n base layer 3 by way of the n channel formed on the surface of the p-base layer 4. Such a flow of electrons operates as a base current of a transistor constituted by the p-emitter layer 2, n-base layer 3 and p-base layer 4.

Then, the base current gives rise to a flow of holes from the p-emitter layer 2 toward the p base layer 4. Such a flow of holes operates as a base current of a transistor constituted by the n-base layer 3, p-base layer 4 and n emitter layer 5.

The base current by turn gives rise to a current of electrons from the n-emitter layer 5 toward the n-base layer 3. Such a flow of electrons operates as a base current of a transistor constituted by the p-emitter layer 2, n-base layer 3 and p-base layer 4. Thus, the holes running through a channel formed on the n-layer 6 are subjected to a carrier conversion so that consequently electrons are supplied to the n-emitter layer 5 and then to the n-base layer 3 via the channel of the MOSFET Tr2a.

As a result of the flows of carriers, the transistor constituted by the p-emitter layer 2, n-base layer 3, p-base layer 4 and the transistor constituted by the n-base layer 3, p-base layer 4 and n-emitter layer 5 mutually amplify the respective collector currents of the other parties to turn on the thyristor.

To turn off the GTO thyristor, a positive voltage is applied to the gate terminal G1 relative to the cathode terminal K.

When such a voltage is applied, the p-channel formed on the n-layer 6 disappears and the supply of electrons from the floating electrode 11 to the n-emitter layer 5 is stopped. As a result, no base current flows through the transistor constituted by the p-base layer 4, n-base layer 3 and p-emitter layer 2 and therefore the GTO thyristor is turned off.

Since only the p-layer 4 is connected, i.e., no n-layer is connected to the cathode electrode 8, no parasitic transistors nor thyristors can appear within the GTO thyristor and, therefore, this GTO thyristor is exempt from the problem of being latched up by a parasitic thyristor or transistor to become disabled from turning off operations.

Thus, the above described embodiment provides a GTO thyristor which is highly susceptible to turn off operations because no parasitic transistors nor thyristors can be generated by a hole current running within the device.

Figure 3:
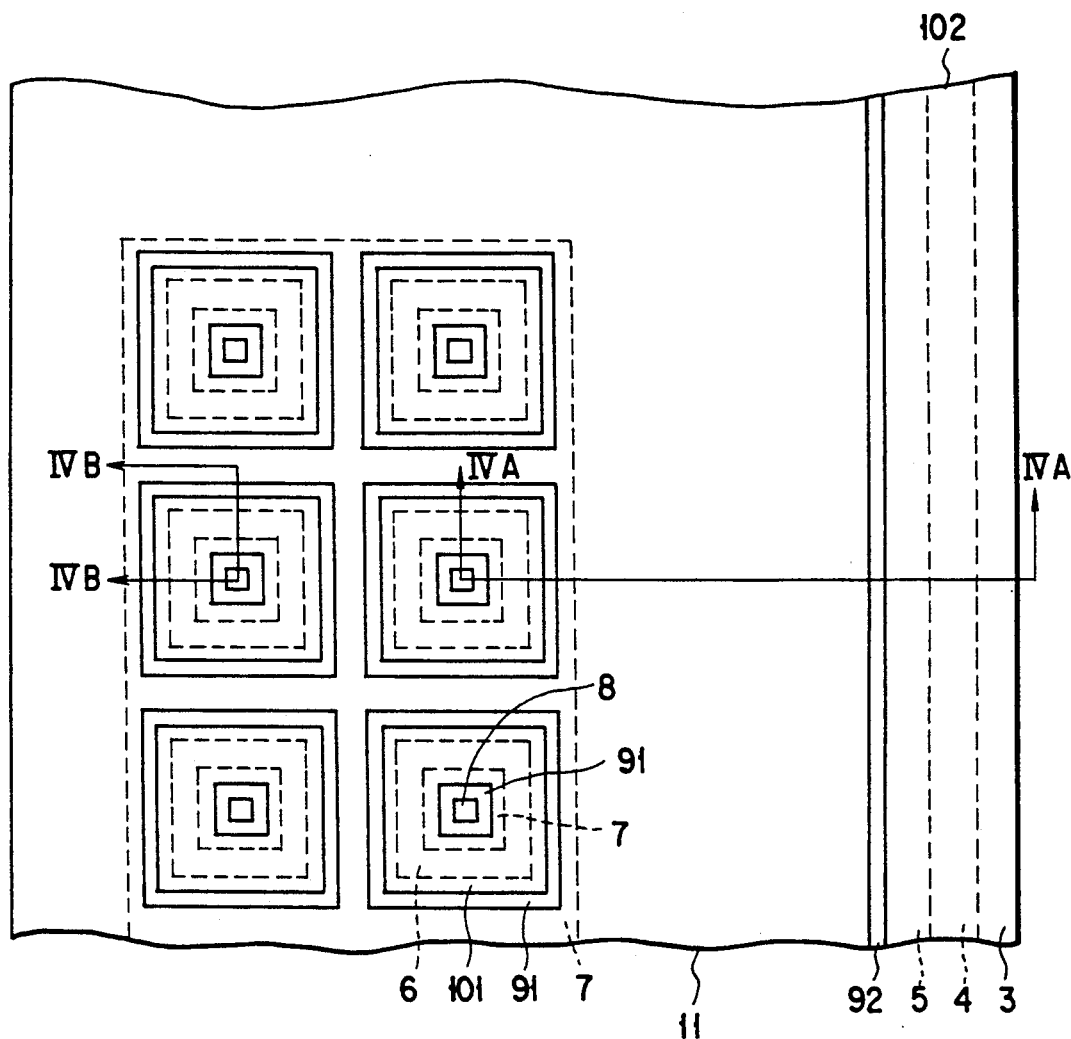
FIG. 3 is a schematic plan view of a GTO thyristor similar to that of FIG. 1 but obtained by modifying it.

FIG. 3 is a schematic plan view of a GTO thyristor similar to that of FIG. 1 but obtained by modifying the pattern of arrangement of electrodes. FIGS. 4A and 4B are sectional views of the GTO thyristor of FIG. 3 respectively taken along IVA—IVA line and IVB—IVB line. FIG. 5 is a schematic plan view of another GTO thyristor similar to that of FIG. 1 but again obtained by modifying the pattern of arrangement of electrodes to appear as stripes. The electrodes may alternatively be coaxially arranged. The components of these modified embodiments that correspond to those of the embodiment of FIG. 1 are respectively denoted by the same reference symbols throughout the drawings.

Figure 6:
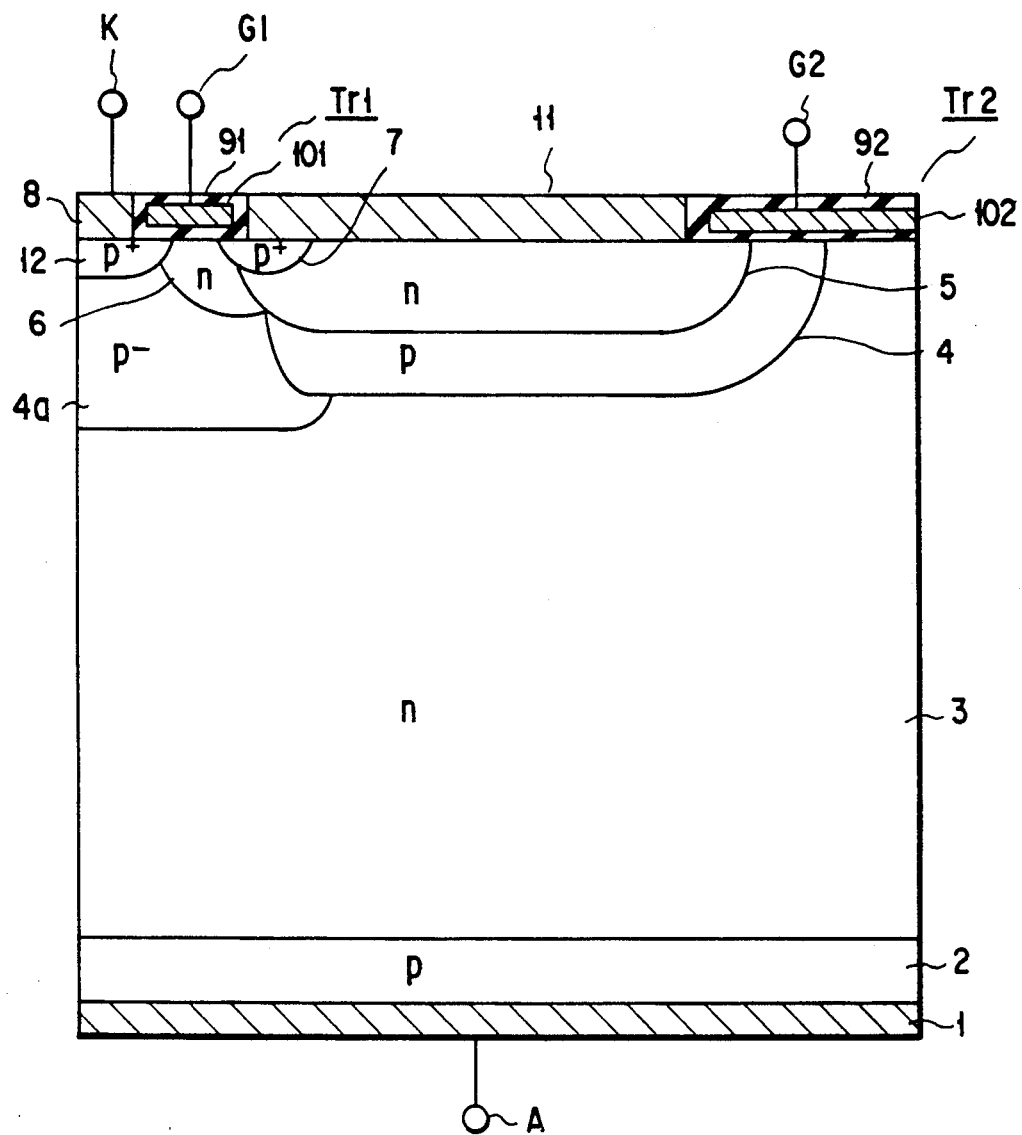
FIG. 6 is a sectional view of a second embodiment of GTO thyristor of the invention.

FIG. 6 is a sectional view of a second embodiment of GTO thyristor of the invention. Again, the components of this embodiment that correspond to those of the embodiment of FIG. 1 are respectively denoted by the same reference signs.

The embodiment of FIG. 6 differs from its counterpart of FIG. 1 in that the p-base layer of the embodiment of FIG. 1 is divided into two layers having different impurity densities, a higher impurity density p-base layer 4 and a lower impurity density p$^-$-layer 4a, and the n-layer 6 is formed on the surface of the lower impurity density p$^-$-layer 4a.

The surface impurity concentration of the n-layer 6 should be set in consideration of the threshold voltage of the MOSFET Tr1. Since the n-layer 6 is formed in the surface of the p-base layer, the impurity concentration of the surface of the p-base layer is necessarily set far lower than that of the n-layer 6. Therefore, where the p-base layer is divided into two layer including a lower impurity density p$^-$-layer 4a, the n-layer 6 can be formed more easily, In other words, the n-layer 6 can be formed in consideration of the threshold voltage of the MOSFET Tr1. Further, since the resistance between the p-base layer 4 and the cathode electrode 8 becomes greater, electrons injected from the n-emitter layer 5 are increased, thus lowering ON voltage.

Note that a high density p$^+$-layer 12 is formed on the surface of the lower p$^-$-base layer 4a located below the cathode electrode 8 of this embodiment in order to hold the p$^-$-base layer 4a in ohmic contact with the cathode electrode 8.

Figure 7:
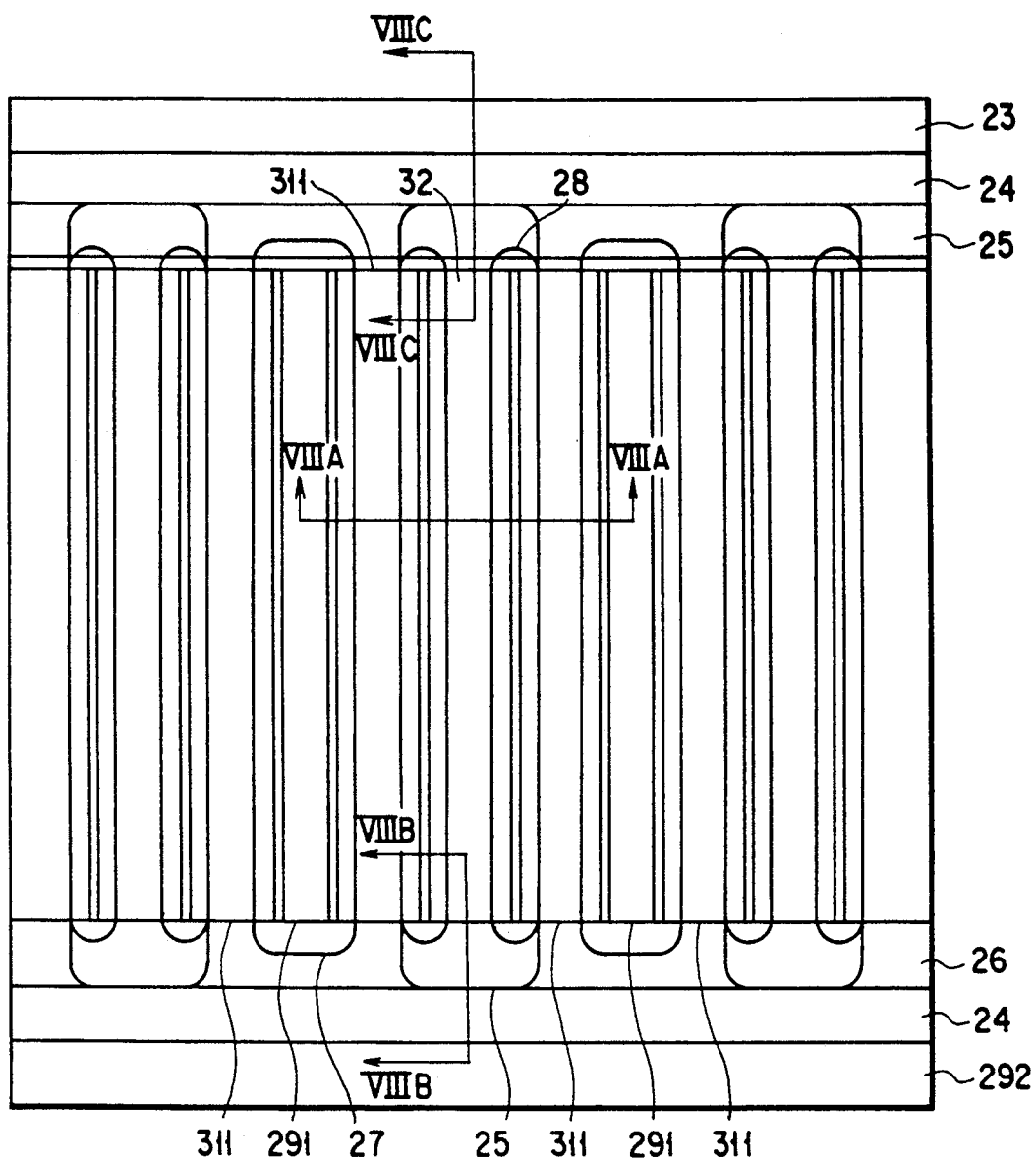
FIG. 7 is a schematic plan view of a third embodiment of GTO thyristor of the invention.

FIG. 7 is a schematic plan view of a third embodiment of GTO thyristor of the invention. FIGS. 8A, 8B and 8C are sectional views of the embodiment of FIG. 7 respectively taken along VIIIA—VIIIA line, VIIIB—VIIIB line and VIIIC—VIIIC line. FIG. 9 is a partially cutout schematic perceptive view of the embodiment of FIG. 7.

In this embodiment, a p-emitter layer 22 is formed on one of the surfaces of an n-base layer 23 and an anode electrode 21 is arranged under the p-emitter layer 22. A p-base layer 24 is formed on the other surface of the n-base layer 23 by diffusion and an n-emitter layer 25 and an n-layer 26 are formed on the p-base layer 24 by diffusion such that said n-layer 26 is junctioned to said n-emitter layer 25. A high density p$^+$-layer 27 is formed on the surface of the n-layer 26. A high density p$^+$-layer 28 is formed on the surfaces of the n-layer 26 and n-emitter layer 25 by diffusion. The n-layer 26 disposed between the p$^+$-layer 28 and said p$^+$-layer 27 provides a p-channel and a gate electrode 311 is formed on the n-channel with a gate oxide film 301 disposed therebetween. In other words, a MOSFET Tr1b is constituted by the semiconductor layers 26, 27, 28, the gate oxide film 301 and the gate electrode 311.

A cathode electrode 291 is disposed on the surface of the p$^+$-layer 27 so that it is electrically connected with a flating electrode 32 disposed on the n-emitter layer 25 when the MOSFET Tr1b is turned on. On the other hand, another cathode electrode 292 is disposed on the p-base layer 24 in order to discharge holes from the GTO thyristor when the device is turned off. The longitudinal direction of the cathodes electrode 292 is perpendicular to that of the cathode electrode 291. Another gate electrode 312 is formed on the surfaces of the n-base layer 23, p-base layer 24 and n-emitter layer 25 with a gate oxide film 302 interposed therebetween so that a MOSFET Tr2b is constituted by these components.

A GTO thyristor having a configuration as described above is also exempt from the problem of being latched up by a parasitic thyristor or transistor to become disabled from turning off operations even if holes are caused to flow through the p-base layer 24 when the GTO thyristor is turned off because no n-layer is connected to the cathode electrodes 291 and 292. Additionally, since this embodiment can accommodate a larger number of channels per unit area than the above described embodiments, it is less susceptible to voltage drops at the channels.

Figure 10:
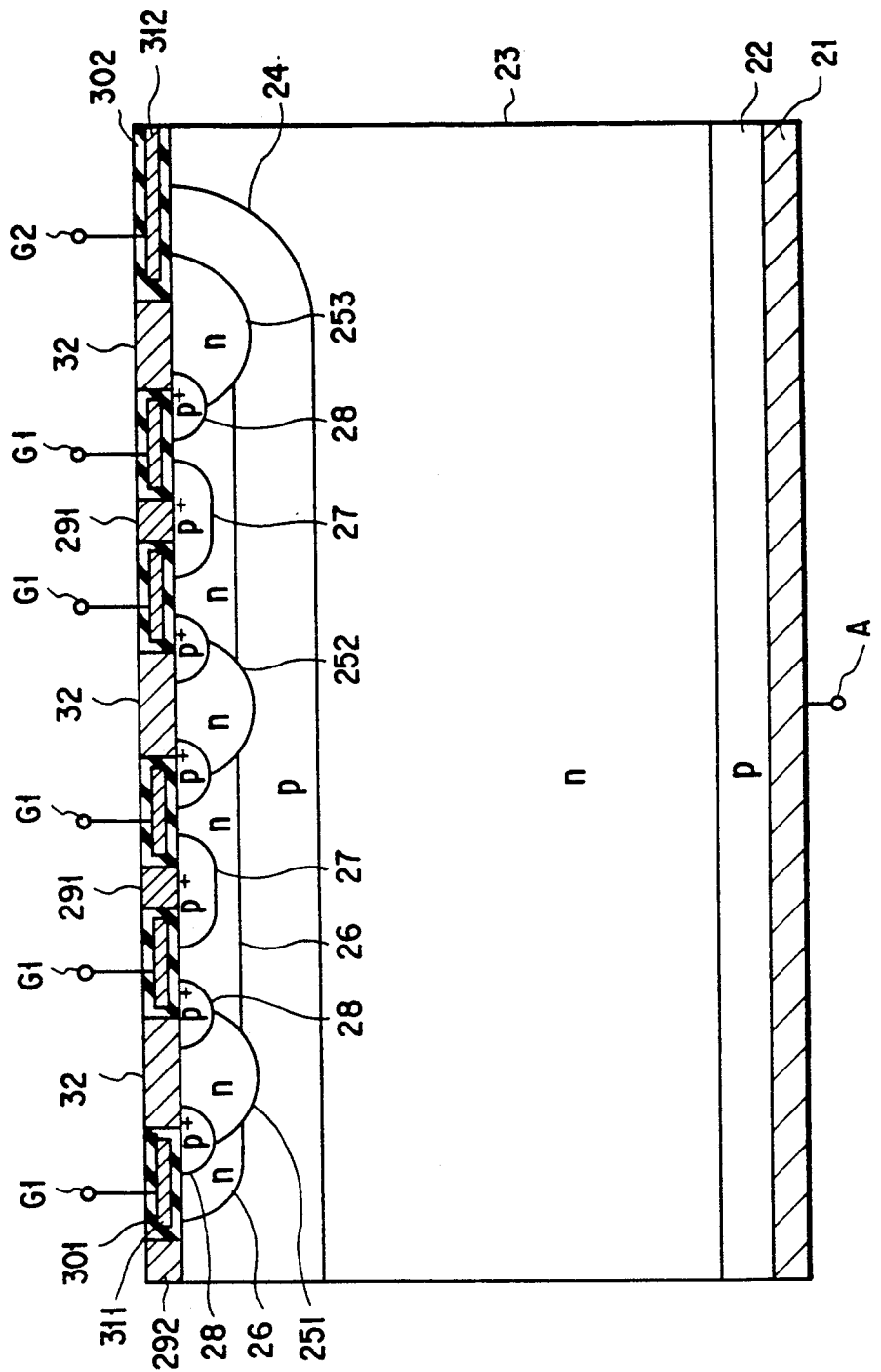
FIG. 10 is a sectional view of a fourth embodiment of GTO thyristor of the invention.

FIG. 10 is a sectional view of a fourth embodiment of GTO thyristor of the invention. Again, the components of this embodiment that correspond to those of the embodiment of FIGS. 7 through 9 are respectively denoted by the same reference signs.

Figure 8:
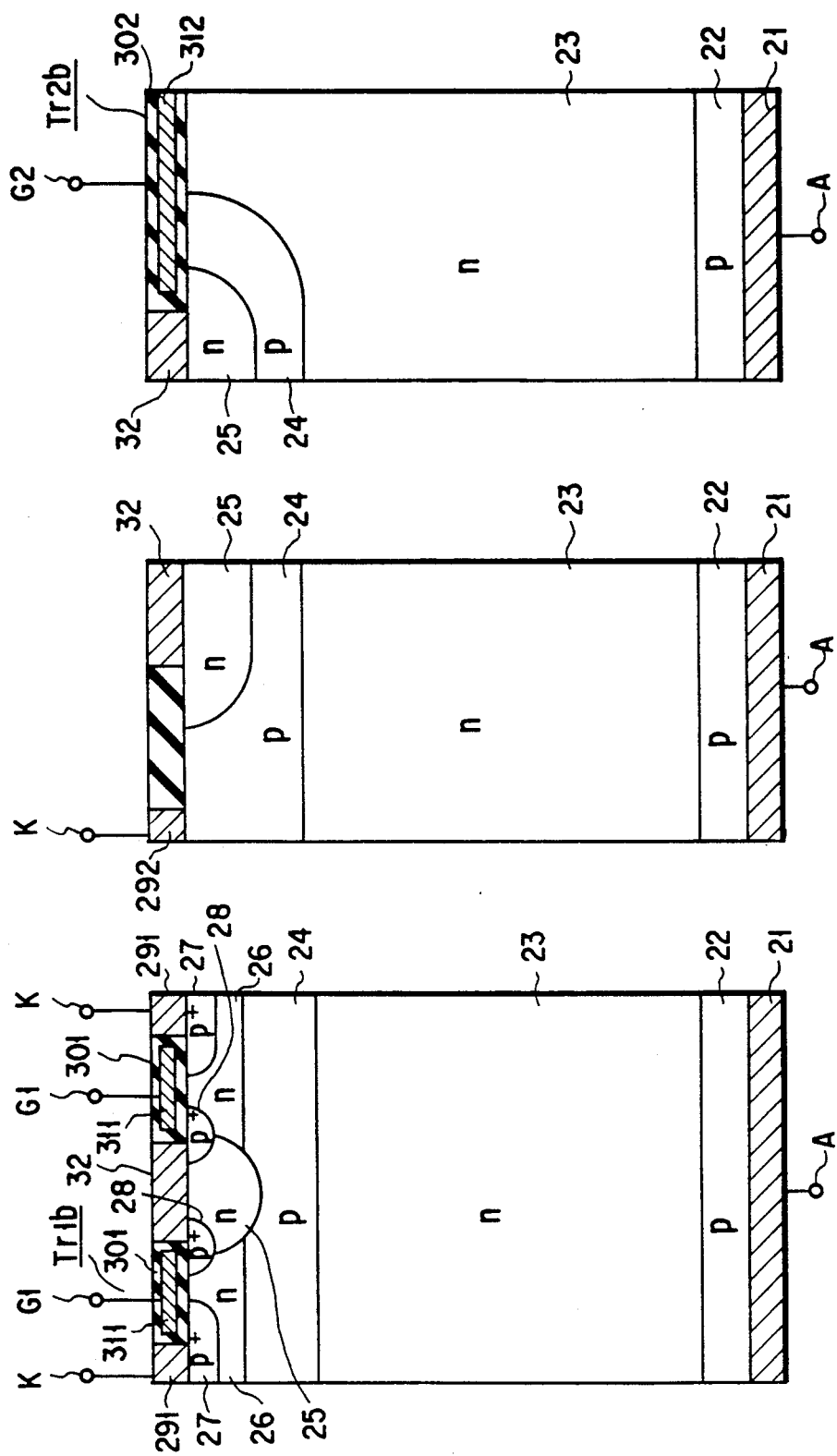
FIGS. 8A, 8B and 8C are sectional views of the embodiment of FIG. 7 respectively taken along VIIIA—VIIIA line, VIIIB—VIIIB line and VIIIC—VIIIC line.

This embodiment differs from the third embodiment of FIGS. 7 through 9 in that the channel forming cathode electrode 291 and the hole discharging cathode electrode 292 are arranged in a same direction and the n-emitter layers 251, 252 and 253 are arranged in parallel with the cathode electrodes 291 and 292 to form so many stripes.

While this embodiment is as advantageous as the preceding embodiments, it additionally has a feature of being capable of uniformly injecting electrons into the p-base layer 24 than any of the preceding embodiments if the n-emitter layers 251, 252 and 253 are made wider toward the right in FIG. 10 so that the ratio of the width of the n-emitters to the number of channels or that of the area of the n-emitter layers to the channel length increases toward the gate electrode G2.

Figure 12:
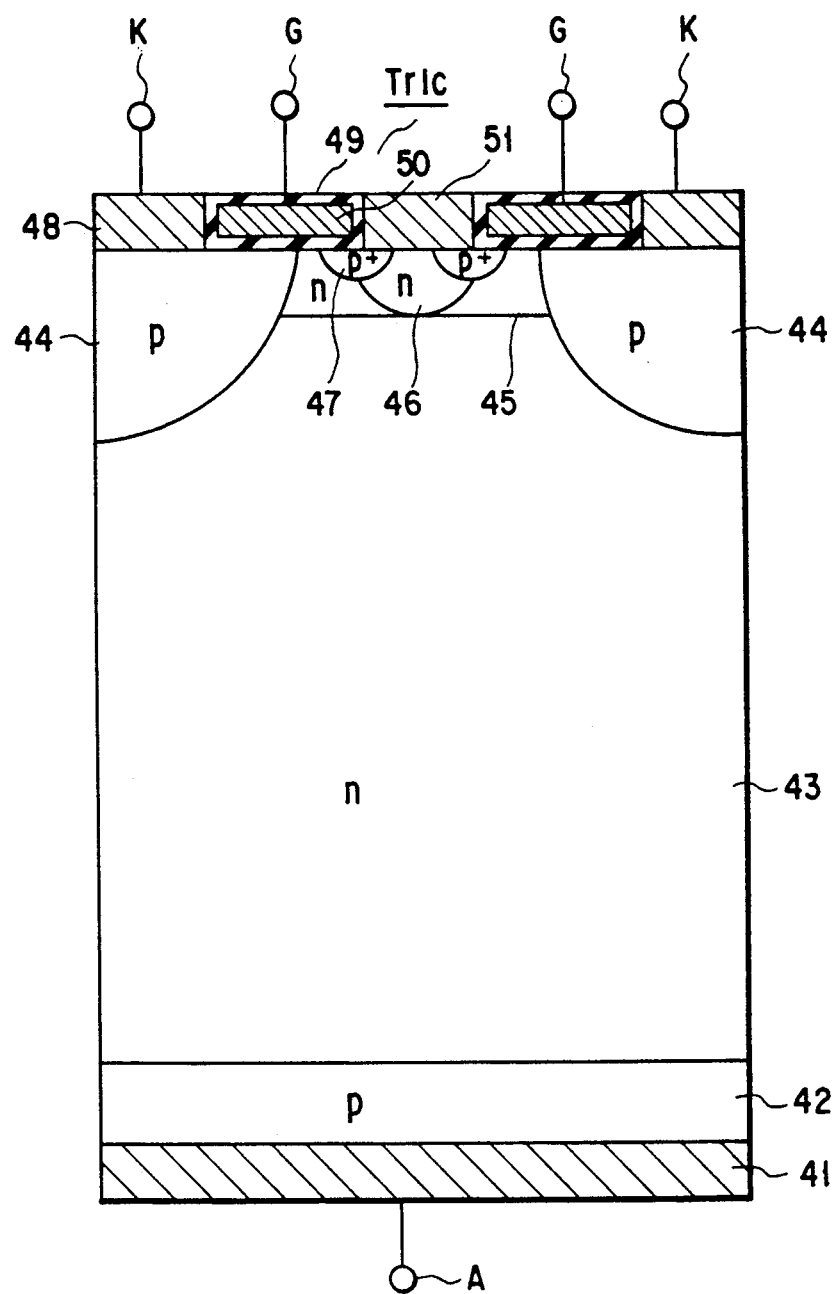
FIG. 12 is sectional view of the embodiment of FIG. 11 taken along XII—XII line.

FIG. 11 is a schematic plan view of a fifth embodiment of GTO thyristor of the invention. FIG. 12 is sectional view of the embodiment of FIG. 11 taken along XII—XII line. This embodiment is obtained by applying the basic idea of the present invention to a GTO thyristor of the type which is normally called a SI thyristor.

The embodiment comprises an n-base layer 43, a p-emitter layer 42 formed on one of the surfaces of the n-base layer 43 by diffusion, an anode electrode 41 disposed under the p-emitter layer 42, a p-base layer 44 formed on the other surface of the n-base layer 43 by diffusion, an n-layer 45 formed on the surface of the n-base layer 43 surrounded by the p-base layer 44 and an emitter layer 46 formed on the n layer 45 by diffusion.

The p-base layer 44 and the n-emitter layer 46 are not held in direct contact and indirectly linked with each other by way of a MOSFET Tr1c. Said MOSFET Tr1c is constituted by the p-base layer 44, a p+-layer 47 formed on the surfaces of the n-layer 45 and n-emitter layer 46 by diffusion, and a gate electrode 50 disposed on these semiconductor layers 44, 45 and 47 with a gate oxide film 49 interposed therebetween.

A cathode electrode 48 and a floating electrode 51 are disposed respectively on the p-base layer 44 and the n-emitter layer 46 while the anode electrode 41, the cathode electrode 48 and the gate electrode 50 are respectively provided with an anode terminal A, a cathode terminal K and a gate terminal G.

To turn on a GTO thyristor having a configuration as described above, a forward voltage is applied between the anode terminal A and the cathode terminal K and then, under this condition, a negative voltage is applied to the gate terminal G relative to the cathode terminal K.

As the voltages are applied, a p-channel is formed on the n-layer 45 under the gate electrode 50 so that the p-base layer 44 is connected to the p+-layer 47 and the cathode electrode 48 is connected to the floating electrode 51 via the p-channel. Consequently, an electric current is supplied to the emitter layer 46 via the p-channel and electrons are injected into the n-base layer 43 from the n-emitter layer 46 to turn on the GTO thyristor.

To turn off the GTO thyristor, a positive voltage is applied to the gage electrode G.

As the voltage is applied, the supply of electric current to the emitter layer 46 is suspended and the potentials of the n-layers 45 and 46 increase, at the same time, a depletion layer develops from the p-base layer 44 and a condition of pinch-off is given rise to between the two adjacent portions of the p-base layer 44 to turn off the GTO thyristor.

This embodiment is as effective as any of the preceding embodiments because no parasitic transistors nor thyristors appear in the embodiment. Additionally, this embodiment is advantageous in that a MOSFET is not required to inject electrons into the n-base layer 43 from the n-emitter layer 46 when the device is turned on because the n-emitter layer 46 and the n-base layer 43 are directly connected with each other. Further, the ON voltage is relatively low due to a diode structure.

Figure 13:
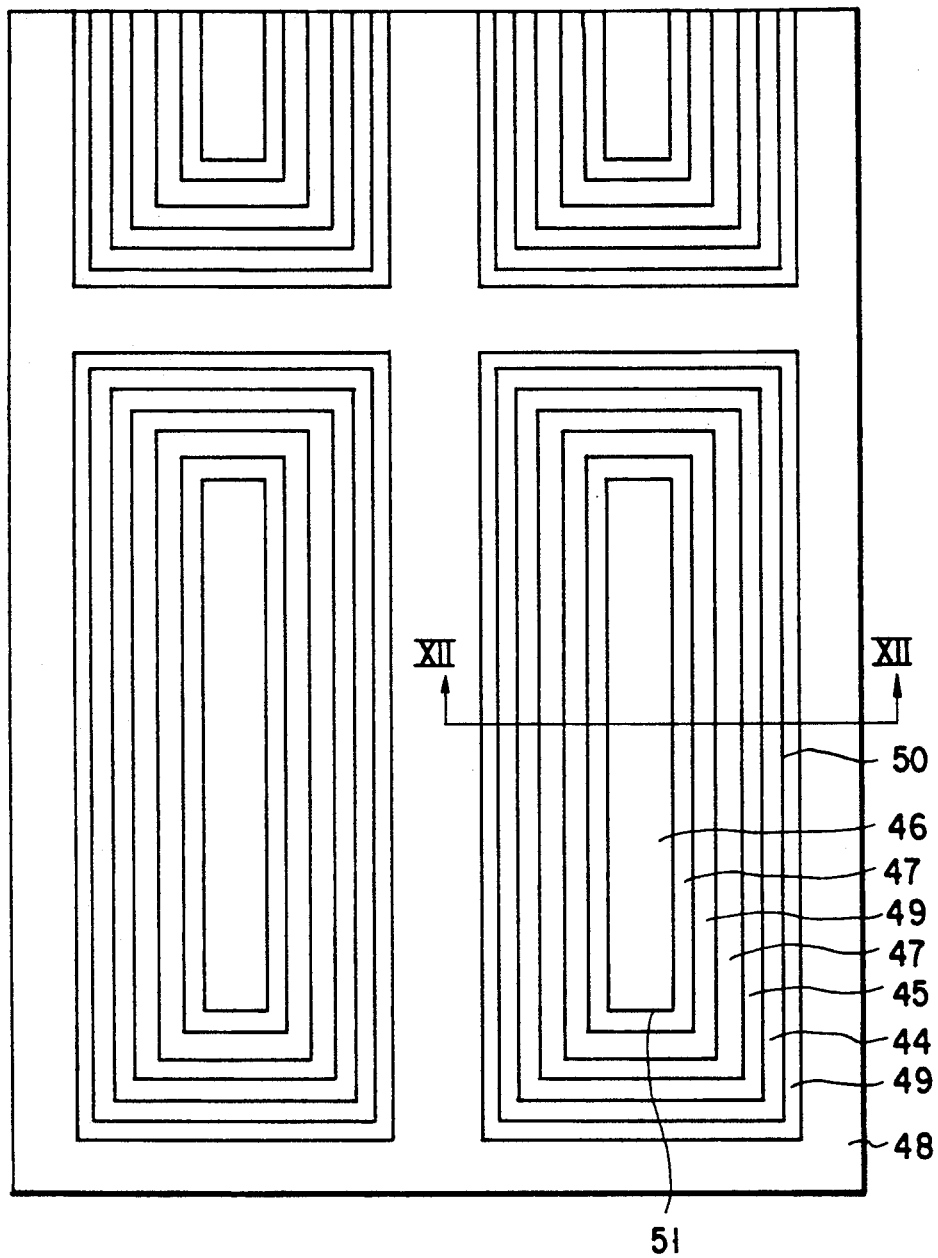
FIG. 13 is a plan view of a GTO thyristor similar to that of FIG. 12 but obtained by modifying it.
Figure 14:
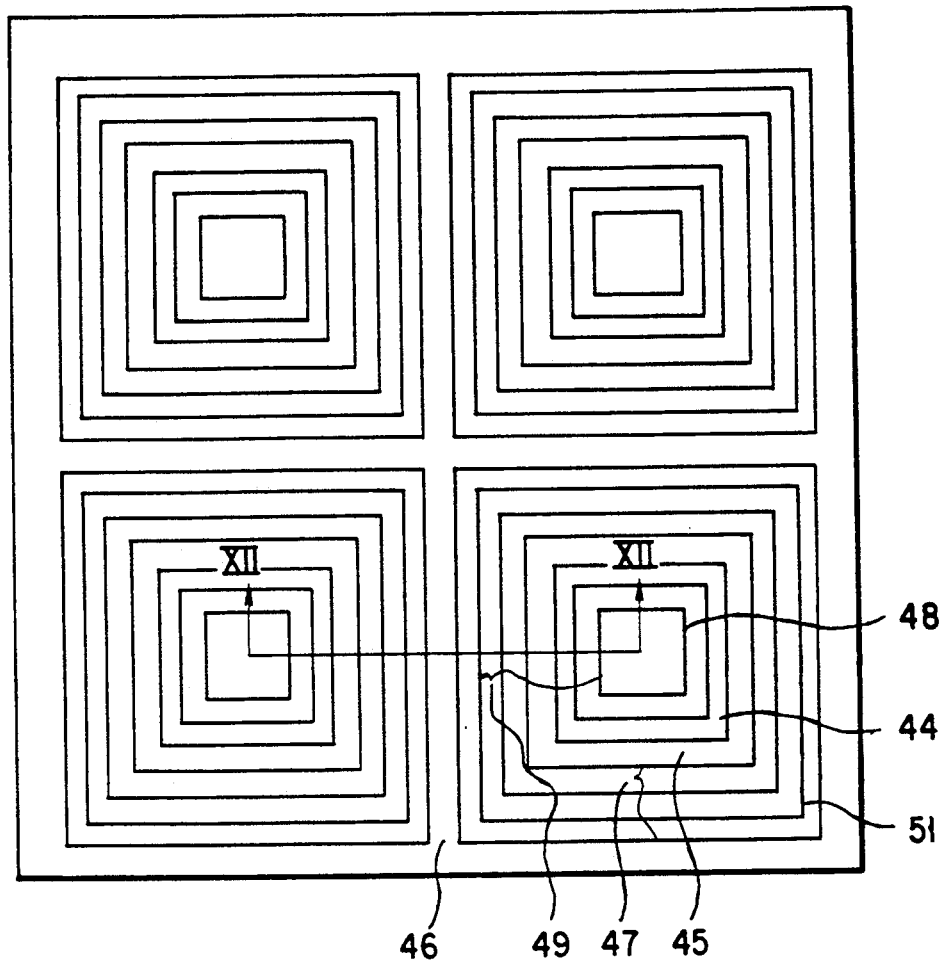
FIG. 14 is a plan view of another GTO thyristor similar to that of FIG. 12 but again obtained by modifying it.

FIGS. 13 and 14 are plan view of two different GTO thyristors similar to that of FIG. 12 but obtained by modifying it. The GTO thyristors of FIGS. 13 and 14 will show a sectional view substantially the same as that of FIG. 11 if taken along respective XII—XII lines. The components of these embodiments that correspond to those of the embodiment of FIG. 11 are respectively denoted by the same reference signs.

The GTO thyristor of FIG. 13 differs from that of FIG. 11 in that, unlike the device of FIG. 11, the n-emitter layer 46 and other related layers of this device shows a pattern of strips. On the other hand, the GTO thyristor of FIG. 14 differs from that of FIG. 11 in that, unlike the device of FIG. 11, the n-emitter layer 46 is peripherally disposed. The n-emitter layer 46 that serves to define patterned squares has a width half as large as that of the corresponding layer of FIG. 13. With such an arrangement, the distance between two adjacent portions of the p-base layer 44 is reduced to make the pinch-off phenomenon even easier to appear in the base layer 44 when the device is turned off. Note that, alternatively, the n-emitter layer 46 may be coaxially arranged.

Figure 15:
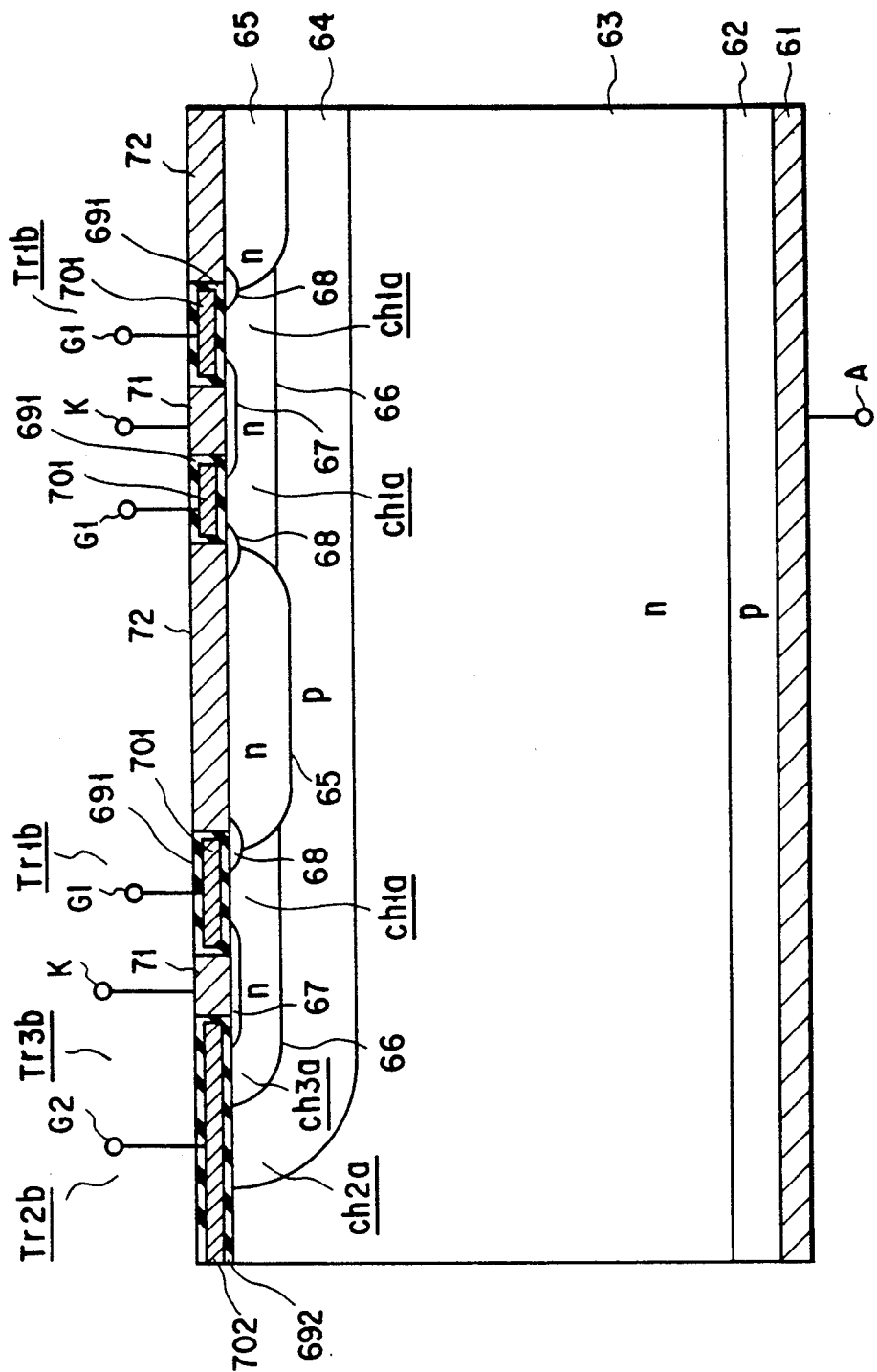
FIG. 15 is a sectional view of a sixth embodiment of GTO thyristor of the invention.

FIG. 15 is a sectional view of a sixth embodiment of GTO thyristor of the invention. This embodiment is obtained by applying the basic idea of the present invention to a GTO thyristor of the type which is normally called an MCT thyristor.

In this embodiment, a p-emitter layer 62 is formed on one of the surfaces of an n-base layer 63 by diffusion and an anode electrode 61 is disposed under the p-emitter layer 62. A p-base layer 64 is formed on the other surface of the n-base layer 63 by diffusion and an n-emitter layer 65 is formed on the surface of the p-base layer 64 by diffusion. An n-layer 66 is formed on the surface of the p-base layer 64 and next to the n-emitter layer 65 to form a p-channel by diffusion. A p+-layer 67 is formed on the surface of the n-layer 66 by diffusion and another p+-layer 68 is formed on the surfaces of the n-layer 66 and n-emitter layer 65 also by diffusion.

A gate electrode 701 is disposed on the surfaces of the p+-layer 67, n-layer 66 and p+-layer 68 with a gate oxide film 691 interposed therebetween and said semiconductor layers 66, 67, 68, the gate oxide film 691 and the gate electrode 701 constitute a MOSFET Tr1b. Another gate electrode 702 is disposed on the surfaces of the p+-layer 67, n-layer 66, p-base layer 64 and n-base layer 63 with a gate oxide film 692 interposed therebetween and these components constitute two other MOSFETs Tr2b and Tr3b. The break down voltage between the n-emitter layer 65 and the p+-layer 68 is set to a value higher than that of the threshold voltage of the MOSFET Tr1b and that of the MOSFET Tr3b. The thresh-old voltage of the MOSFET Tr1b is higher than that of the MOSFET Tr2b.

A cathode electrode 71 is disposed on the p+-layer 67 and a flating electrode 72 is disposed on the n-emitter layer 65. The anode electrode 61, the cathode electrode 71, the gate electrode 701 and the gate electrode 702 are respectively provided with an anode terminal A, a cathode terminal K, a gate terminal G1 and another gate terminal G2.

To turn on a GTO thyristor having a configuration as described above, a forward voltage is applied between the anode terminal A and the cathode terminal K and then, under this condition, a negative voltage is applied to the gate terminal G1 relative to the cathode terminal K while a positive voltage is applied to the gate electrode G2 relative to the cathode terminal K.

As the voltages are applied, a p-channel ch1a is formed on the n-layer 66 under the gate electrode 701 and an n-channel ch2a is formed on the p-base layer 64 under the gate electrode 702. As the p-channel ch1a is formed, the cathode electrode 71 is connected to the floating electrode 72 via the channel ch1a to apply a negative voltage to the n-emitter layer 65. Then, an electric current is supplied to the n-emitter layer 65 by way of the p-channel ch1a and, at the same time, electrons are injected into the n-base layer 63 from the n-layer 66 by way of the n-channel ch2a to turn on the GTO thyristor.

To turn off the GTO thyristor, a positive voltage is applied to the gate terminal G1 relative to the cathode terminal K while a negative voltage is applied to the gate terminal G2 relative to the cathode terminal K.

As the voltages are applied, the p-channel ch1a disappears and the supply of electric current to the emitter layer 46 is suspended while holes within the device are discharged to the cathode electrode 71 by way of a p-channel ch3a formed on the n-layer 66 under the gate electrode 702 so that no electric current can take place in the device. Then, since no parasitic transistors can appear in the GTO thyristor, the device is consequently turned off.

Since no n-layer is connected to the cathode electrode 71, no parasitic transistors nor thyristors can appear within the GTO thyristor and, therefore, this GTO thyristor is exempt from the problem of being latched up by a parasitic thyristor or transistor to become disabled from turning off operations. Thus, there is provided a GTO thyristor which is highly susceptible to turn off operations.

Figure 16:
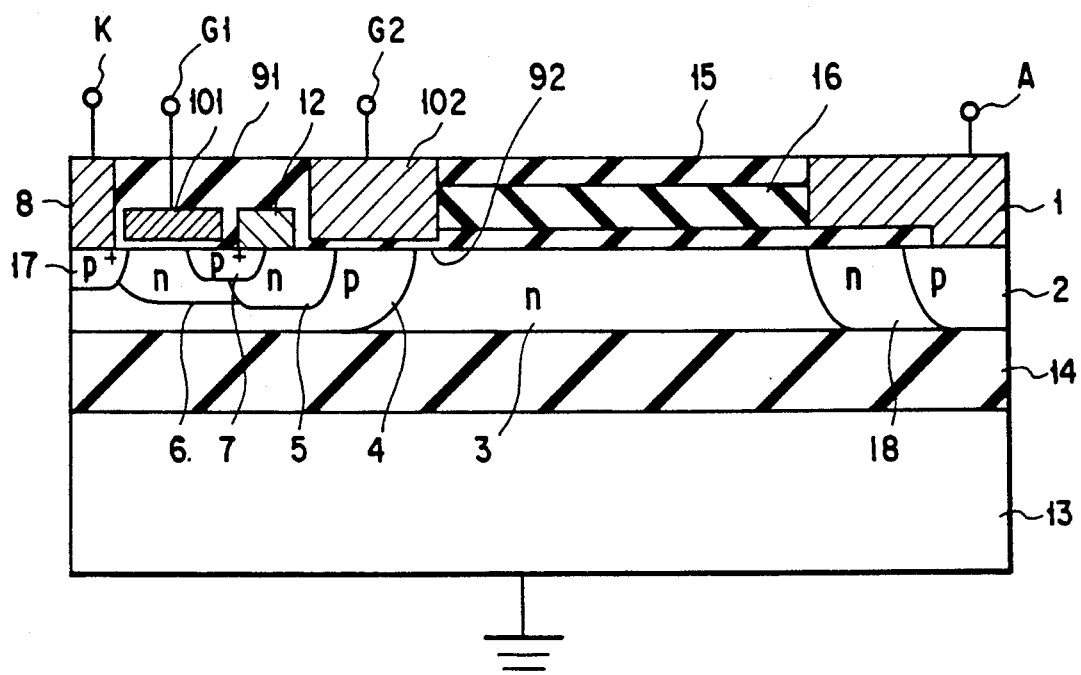
FIG. 16 is a sectional view of a seventh embodiment of GTO thyristor of the invention.

FIG. 16 is a sectional view of a seventh embodiment of GTO thyristor of the invention. This embodiment is obtained by modifying the GTO thyristor of FIG. 2 to show an SOI structure. The components of the embodiment that correspond to those of the embodiment of FIG. 2 are respectively denoted by the same reference signs.

In this embodiment, the main body of a GTO thyristor is formed on a substrate 13 with an $SiO_2$ film 14 interposed therebetween and the anode electrode 1 and the gate electrode 102 of the device are electrically separated by a SIPOS film 16 and an $SiO_2$ film 15 respectively. Additionally, an n-buffer layer 18 is disposed between the n-base layer 3 and the p-emitter layer 2 and a high density $p^+$-layer 17 is disposed under the cathode electrode 8 and junctioned to the n-layer 6.

Figure 17:
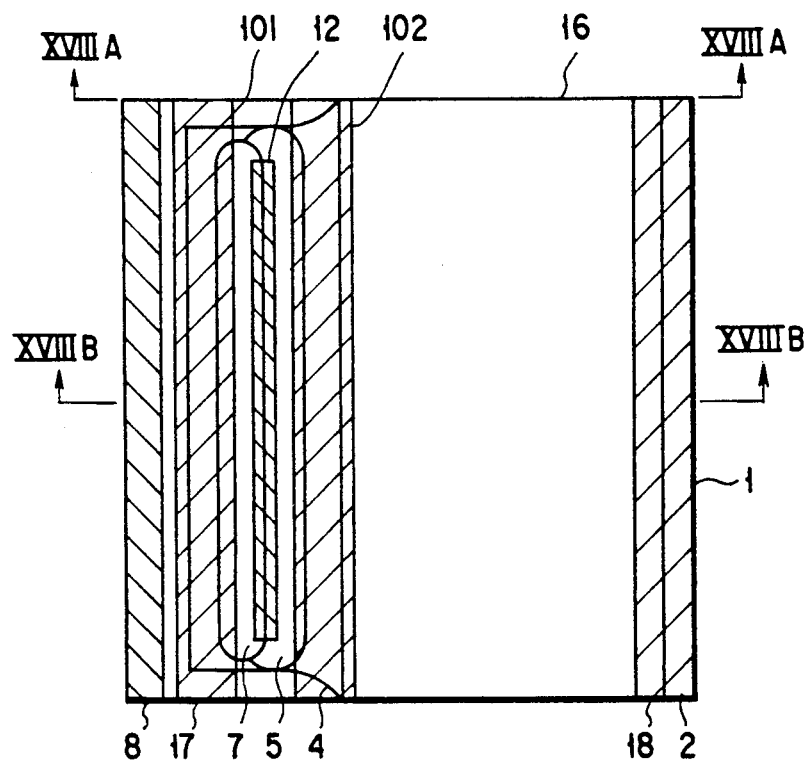
FIG. 17 is a plan view of a GTO thyristor similar to that of FIG. 16 but obtained by modifying it.
Figure 18A:
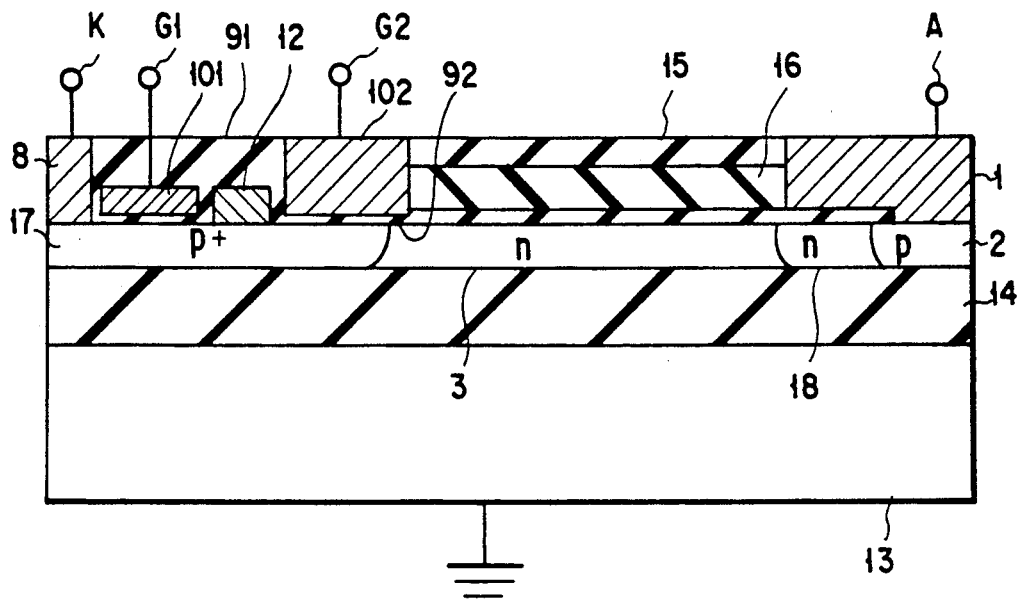
FIGS. 18A and 18B are sectional views of the GTO thyristor of FIG. 17 respectively taken along XVIIIA—XVIIIA line and XVIIIB—XVIIIB line.
Figure 18B:
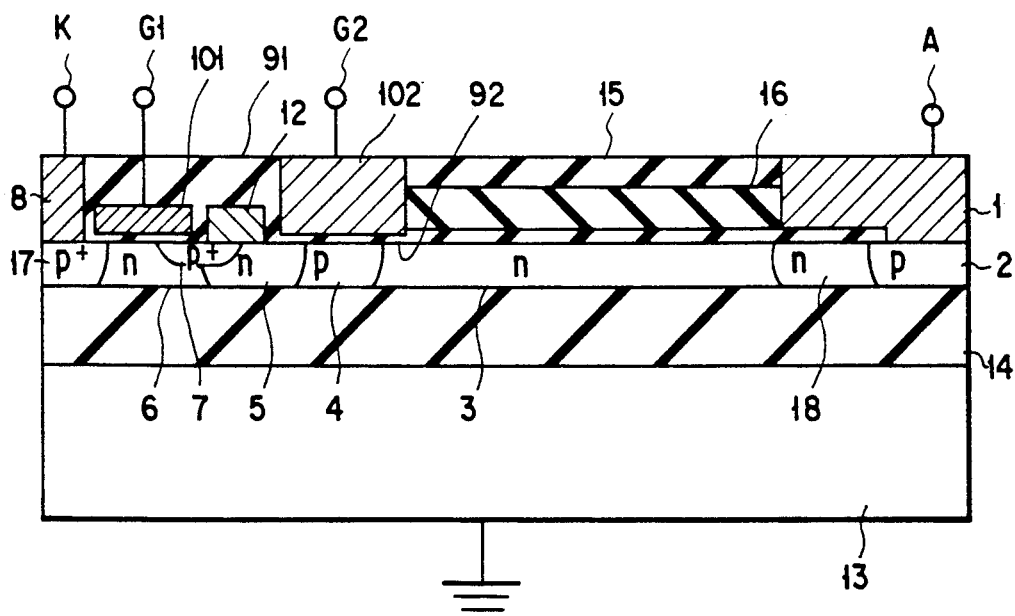
Figure 19:
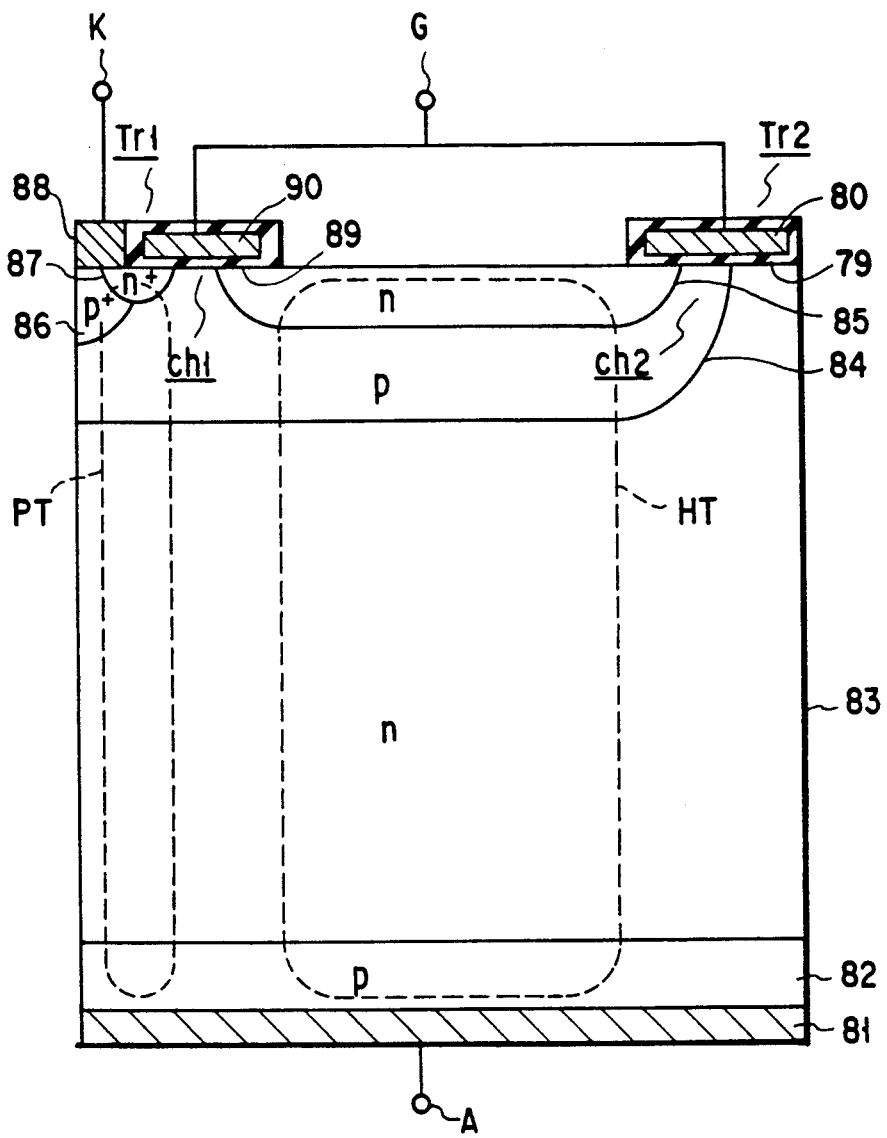
FIG. 19 is a sectional view of a conventional GTO thyristor.

FIG. 17 is a plan view of a GTO thyristor similar to that of FIG. 16 but obtained by modifying it. FIGS. 18A and 18B are sectional view of the GTO thyristor of FIG. 17 respectively taken along XVIIIA—XVIIIA line and XVIIIB—XVIIIB line. The components of the modified embodiment that correspond to those of the embodiment of FIG. 16 are respectively denoted by the same reference signs.

In this GTO thyristor, the $p^+$-layer 17, the n-emitter layer 5 and the n-layer 6 are held in contact with the $SiO_2$ film 14.

With such an arrangement, since the p-base layer 4 is connected to the electrode 8 through $p^+$-layer 17 bypassing the n-emitter layer 5, resistance for discharging holes becomes greater, and electrons are injected effectively. As a result, the number of accumulated carriers is increased when the device is made ON, so that the device has a low ON voltage.

The present invention is not limited to the above described embodiments. For example, as the seventh embodiment of FIG. 16 is obtained by modifying the first embodiment to show an SOI structure, so any of the other embodiment may be modified to show a similar SOI structure. Again, while MOSFETs are used in the above embodiments, field effect transistors of any other type may alternatively be used. Various other changes and modifications may be made within the scope and spirit of the present invention.

What is claimed is:

1. A GTO thyristor comprising:
    an emitter layer of a first conductivity type, a base layer of a second conductivity type, a base layer of said first conductivity type, and an emitter layer of said second conductivity type arranged to form a pnpn structure;
    a first region formed of a semiconductor of said second conductivity type, said first region comprising a surface and being in contact with said emitter layer of said second conductivity type;
    a second region formed of a semiconductor of said first conductivity type, and second region extending from said first region to said emitter layer of said second conductivity type;
    a third region formed of a semiconductor of said first conductivity type, said third region being disposed opposite to said second region with said first region disposed therebetween, said third region being connected to said base layer of said first conductivity type;
    a first main electrode connected to said emitter layer of said first conductivity type;
    a second main electrode connected to said third region;
    a conductive layer formed on said emitter layer of said second conductivity type and on said second region to form a connection therebetween;
    a first gate electrode disposed on said first region with an insulating film interposed therebetween so as to form a first FET, said first FET utilizing the surface of said first region as a channel of said first conductivity type; and
    a second gate electrode disposed on said base layer of said first conductivity type with an insulating film interposed therebetween so as to form a second FET, said second FET utilizing a surface of said base layer of said first conductivity type as a channel of said second conductivity type.

2. A thyristor according to claim 1, wherein said third region is part of said base layer of said first conductivity type.

3. A thyristor according to claim 1, wherein said third region is connected to said base layer of said first conductivity type by the use of a highly resistive semiconductor layer of said first conductivity type.

4. A thyristor according to claim 1, wherein said second main electrode which is connected to said third region comprises a cathode electrode, and wherein a separate cathode electrode is connected to said base layer of said first conductivity type.

5. A thyristor according to claim 1, wherein said first gate electrode is so arranged as to surround said second main electrode.

6. A thyristor according to claim 1, wherein the channels of said first and second FETs are formed parallel to one another.

7. A thyristor according to claim 1, wherein the channels of said first and second FETs are formed in directions perpendicular to one another.

8. A thyristor according to claim 1, wherein said conductive layer is a floating electrode.

9. A thyristor according to claim 1, wherein said first main electrode, said emitter layer of said first conductivity type, said base layer of said second conductivity type, said base layer of said first conductivity type, said emitter layer of said second conductivity type, and said second main electrode are vertically arranged to form a multilayer structure.

10. A thyristor according to claim 1, wherein said emitter layer of said first conductivity type, said base layer of said second conductivity type, said base layer of said first conductivity type, and said emitter layer of said second conductivity type are laterally arranged on an insulation layer which is formed on a semiconductor substrate.

11. A GTO thyristor comprising:
an emitter layer of a first conductivity type;
a base layer of a second conductivity type held in contact with said emitter layer of said first conductivity type;
a base layer of said first conductivity type held in contact with said base layer with said second conductivity type but not held in contact with said emitter layer of said first conductivity type, said base layer of said first conductivity type comprising first and second portions separated from and arranged opposite to one another;
an emitter layer of a second conductivity type held in contact with said base layer of said second conductivity type but not held in contact with said emitter layer of said first conductivity type, said emitter layer of said second conductivity type being disposed between said first and said second portions of said base layer of said first conductivity type;
a first region formed of a semiconductor of said second conductivity type, said first region comprising a first portion formed between said emitter layer of said second conductivity type and said first portion of said base layer of said first conductivity type, and a second portion formed between said emitter layer of said second conductivity type and said second portion of said base layer of said first conductivity type, both of said first and said second portions of said first region comprising surfaces;
a second region formed of a semiconductor of said first conductivity type, and second region extending from said first region to said emitter layer of said second conductivity type, said second region comprising first and second portions with said emitter layer of said second conductivity type formed therebetween, said first and second portions of said second region being respectively disposed opposite to said first and second portions of said base layer of said first conductivity type with said first and second portions of said first region disposed therebetween;
a first main electrode connected to said emitter layer of said first conductivity type;
a second main electrode connected to said base layer of said first conductivity type;
a conductive layer formed on said emitter layer of said second conductivity type and on said second region to form a connection therebetween; and
a gate electrode disposed on said first region with an insulating film interposed therebetween so as to form an FET, said FET comprising first and second portions, said first and second portions utilizing the surfaces of said first and second portions of said first region as channels of said first conductivity type.

12. A thyristor according to claim 11, wherein said base layer of said first conductivity type is so arranged as to surround said emitter layer of said second conductivity type.

13. A thyristor according to claim 11, wherein said emitter layer of said second conductivity type is so arranged as to surround each of sad first and second portions of said base layer of said first conductivity type.

14. A thyristor according to claim 11, wherein said conductive layer is a floating electrode.

15. A GTO thyristor comprising:
an emitter layer of a first conductivity type, a base layer of a second conductivity type, a base layer of said first conductivity type, and an emitter layer of said second conductivity type arranged to form a pnpn structure;
a first region formed of a semiconductor of said second conductivity type, said first region comprising first and second portions and being in contact with said emitter layer of said second conductivity type and said base layer of said first conductivity type, said first and second portions of said first region comprising surfaces;
a second region formed of a semiconductor of said first conductivity type, said second region extending from said first region to said emitter layer of said second conductivity type;
a third region formed of a semiconductor of said first conductivity type, said third region being disposed opposite to said second region with said first portion of said first region disposed therebetween, and disposed further opposite to said base layer of said first conductivity type with said second portion of said first region disposed therebetween;
a first main electrode connected to said emitter layer of said first conductivity type;
a second main electrode connected to said third region;
a conductive layer formed on said emitter layer of said second conductivity type and on said second region to form a connection therebetween;
a first gate electrode disposed on said first region with an insulating film interposed therebetween so as to form a first FET, said first FET utilizing the surface of said first portion of said first region as a channel of said first conductivity type; and
a second gate electrode disposed on said base layer of said first conductivity type and on said first region with an insulating film interposed therebetween so as to form a second FET, said second FET utilizing a surface of said base layer of said first conductivity type as a channel of said second conductivity type and utilizing the surface of said second portion of said first region as a channel of said first conductivity type.

16. A thyristor according to claim 11, wherein said conductive layer is a floating electrode.

* * * * *